United States Patent [19]

Nakagawa et al.

[11] 4,283,632
[45] Aug. 11, 1981

[54] ELECTRON BEAM APERTURE DEVICE

[75] Inventors: Seiichi Nakagawa; Takayoshi Ikeda, both of Akishimashi, Japan

[73] Assignee: Nihon Denshi Kabushiki Kaisha, Tokyo, Japan

[21] Appl. No.: 86,254

[22] Filed: Oct. 18, 1979

[30] Foreign Application Priority Data

Oct. 23, 1978 [JP] Japan ................................ 53/130250

[51] Int. Cl.³ ............................................... G01J 1/00
[52] U.S. Cl. ...................................... 250/503; 250/505
[58] Field of Search ................ 250/503, 505, 515, 514

[56] References Cited

U.S. PATENT DOCUMENTS 3,227,880  1/1966  Wideröe .............................. 250/505

Primary Examiner—Bruce C. Anderson
Attorney, Agent, or Firm—Webb, Burden, Robinson & Webb

[57] ABSTRACT

A 10 to 50 microns thick apertured foil is coated on at least one of its sides with a material having a thickness of about 10 to 100 microns. The atomic number of the coating material is such that characteristic X-rays generated are effectively absorbed.

7 Claims, 6 Drawing Figures

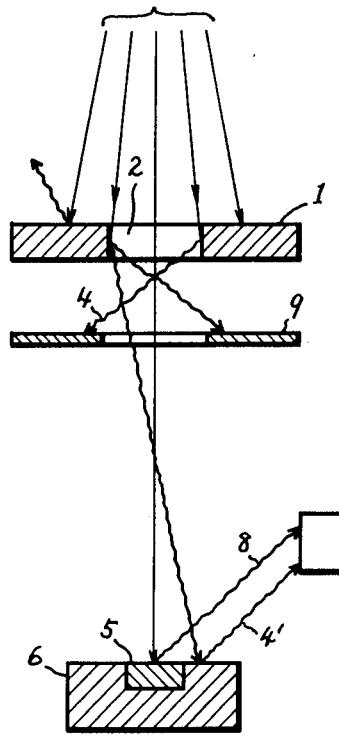
Fig. 1 PRIOR ART
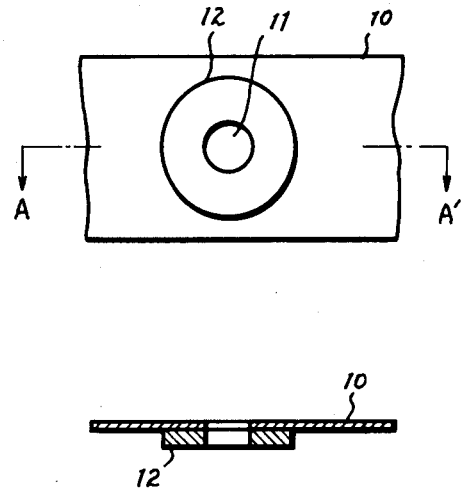
Fig. 2
Fig. 3
Fig. 5    Fig. 6
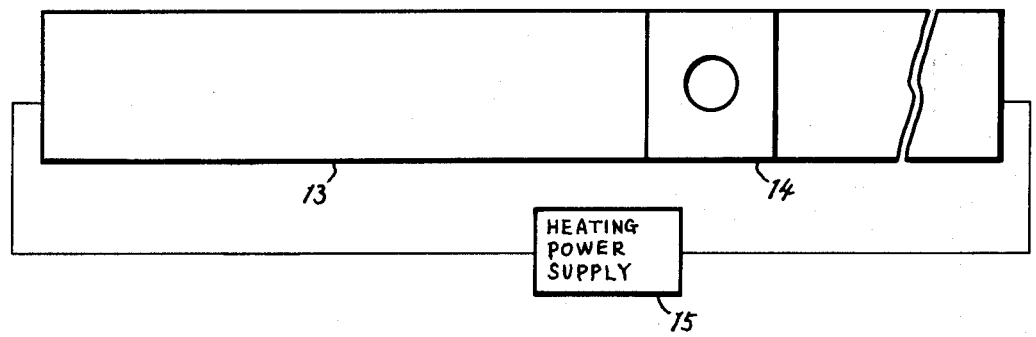
Fig. 4

ELECTRON BEAM APERTURE DEVICE

BACKGROUND OF THE INVENTION

This invention relates to an electron beam aperture device for use in a scanning electron microscope or other such electron beam apparatus.

In a scanning electron microscope or X-ray microanalyzer, analysis of the elements contained in the specimen under examination is carried out by measuring the energy (or wavelength) of the characteristic X-rays which are generated when the electron beam irradiates said specimen. However, in the type of apparatus in question, stray X-rays emanating from various mechanical appurtenances in and around the beam path, especially any aperture mechanism located in the vicinity of the specimen, are detected by the incorporated X-ray spectrometer. This is a cause of signal background noise which is especially pronounced if the detector happens to be an energy dispersive type X-ray spectrometer.

FIG. 1 is a schematic drawing for explaining the drawbacks inherent in the prior art. Referring to the figure, an aperture disk 1 is provided with a thru-hole 2 through which an electron beam 3 passes. The disk 1 is made, as a general rule, of tantalum or platinum and is machined to thickness of approximately 0.6 mm. Some of the X-rays (stray X-rays) 4 emanating from the sidewalls of the thru-hole 2, resultant upon electron beam impingement thereon, are directed towards and strike up against the specimen 5 and its holder 6. This, in turn, results in the emanation of further X-rays 4' which are detected by an energy dispersive type X-ray spectrometer 7 and which are different from the X-rays 8 (also detected by spectrometer 7) emanating from the specimen 5, resultant upon direct electron beam irradiation thereon. Accordingly, the signal attributable to the X-rays 4' is mixed with the "true" signal attributable to X-rays 8 and, because of this, the presence of background noise is unavoidable. As a means of alleviating this problem, that is, obstructing the passage of stray X-rays 4, an additional aperture plate 9, having a thruhole diameter somewhat larger than that of the aperture disk 1, has been incorporated and arranged below this disk aperture 1. However, said means is not sufficiently effective to be considered satisfactory, not to mention the fact that aligning the two aperture centers is troublesome to say the least.

SUMMARY OF THE INVENTION

Briefly according to this invention, the aperture disk 1 is replaced with a thin foil baffle with an aperture therein. By so doing, the quantity of X-rays emanating from the sidewalls of the aperture is considerably reduced as the thickness of the foil is much less (only about 10 microns) than that of the disk type aperture. Preferably, the foil is made of molybdenum, tantalum, tungsten or platinum and thus the thru-hole can be pierced by means of the photo-etching technique which means that high precision processing is available. This is not possible in the case of the thicker disk type aperture, since machine or electron beam processing is necessary.

Another advantage of the foil type baffle according to this invention, is that since its electrical resistance is comparatively high, it is possible to heat up the aperture simply by applying the necessary D.C. current thereto in situ. This is convenient as it means that contamination removal can be accomplished by heating the aperture up to 1000° C. or more without having to remove the aperture from the interior of the microscope to the atmosphere. In fact, by keeping the aperture at 350° C. or more, the aperture will remain free from contamination at all times. Contamination which is electrically unconductive and therefore undesirable as far as the efficient functioning of electron beam devices is concerned, is attributed mainly to the polymerization of hydro-carbon gas molecules contained in the residual gas molecules lying in the vicinity of the aperture foil (due to electron beam irradiation) and the depositing of said polymerized molecules on the aperture foil.

Foil type apertured baffles possess certain advantages over the more conventional disk type baffles. One drawback with the foil types is that, since they are so thin, when X-rays are generated as a result of electron beam generation, some of them are emitted from the underside of the foil itself. This was proven by experiment. The applicants used a sheet of molybdenum foil having no thru-hole instead of the normal aperture. The foil was then irradiated by an electron beam and the quantity of X-rays detected by the spectrometer was measured. However, even though the presence of X-rays was confirmed, the inventor concluded that the quantity of X-rays emitted from both the inner wall of the thru-hole and the foil itself was considerably less than the quantity of X-rays emitted from only the inner wall of the thru-hole in the case of the disk aperture.

An object of this invention, is to further reduce the quantity of stray X-rays emanating from the apertured foil. This object is achieved by a thin layer or coating on the side of the foil not facing the electron beam source comprising a material having an atomic number larger than that of the foil. In an alternate embodiment, this object is achieved by a thin layer or coating on the side facing the electron beam source comprising a material having an atomic number smaller than that of the foil.

THE DRAWINGS

FIG. 1 is a schematic drawing showing the electron beam aperture, specimen and X-ray spectrometer in a conventional (prior art) scanning electron microscope, FIGS. 2 and 3 are schematic drawings showing one embodiment of this invention, and FIGS. 4, 5 and 6 are schematic drawings showing other embodiments according to this invention.

DESCRIPTION OF THE PREFERRED EMBODIMENTS

This invention is characterized in that a molybdenum (Mo), tantalum (Ta), tungsten (W) or platinum (Pt) foil having a thickness of about 10 to 50 microns is coated on the underside (i.e., the side not facing the electron beam source) with W, Pd, Pt, Au or any suitable material having an atomic number larger than that of the aperture foil to a thickness of about 10 to 100 microns. Additionally, this invention includes an embodiment in which the aperture foil having a thickness of about 10 to 50 microns is coated on the upper side (i.e., the side facing the electron beam) with W, Pd, Pt, Au or any suitable material having an atomic number smaller than that of the aperture foil to a thickness of about 10 to 100 microns.

FIG. 2 shows one embodiment according to the subject invention and FIG. 3 shows a cross-section of FIG. 2 through AA'. In this particular embodiment, the stripshaped Mo aperture foil 10 has a thickness of about 10 microns, the coating material is tungsten (W), and the coating thickness is about 20 microns. The aperture hole 11 through which the electron beam passes is surrounded by the layer 12 of coating material on the lower side of the foil.

FIG. 4 shows another embodiment of the subject invention. In this case the thickness of the tantalum aperture foil 13 remains the same as in the FIGS. 2 and 3 embodiment. However, the thickness of the coating material 14 is about 10 microns and the coating material, instead of being tungsten, is platinum. Further, a heating current power supply 15 is provided so at to pass a heating current through the Ta aperture foil 13.

The choice of coating material is determined so as to satisfy the following requirements:

(1) the atomic number of the coating material is larger than that of the material constituting the aperture foil.

(2) the thermal (linear) expansion coefficient of the coating material is about the same as that of the material constituting the aperture foil.

Satisfying requirement (1) ensures that the coating material effects maximal X-ray absorption, and satisfying requirement (2) ensures that the coating material does not crack and break away from the aperture foil when the aperture foil is heated. The table below shows the thermal (linear) expansion coefficients of various elements.

| Element | Atomic No. | Thermal Expansion Coeff. |
|---------|------------|--------------------------|
| Cr | 24 | $11 \times 10^{-6}$ |
| Mo | 42 | $3.7 \sim 5.3 \times 10^{-6}$ |
| Pd | 46 | $11 \times 10^{-6}$ |
| Ta | 73 | $6.6 \times 10^{-6}$ |
| W | 74 | $4.5 \times 10^{-6}$ |
| Pt | 78 | $8.9 \times 10^{-6}$ |
| Au | 79 | $14 \times 10^{-6}$ |

It will thus be appreciated that in the interests of requirement 2, of the elements listed, W would be the best coating material for Mo foil.

In this invention, a 10 to 50 microns thick foil is used as an aperture foil, because a foil less than about 10 microns thick is too thin to process, and a foil more than about 50 microns thick cannot be pierced with high precision. Moreover, in this invention, a 10 to 100 microns thick layer is coated on the aperture foil, because a coating layer less than about 10 microns thick is unable to sufficiently absorb the X-rays, and because a coating layer more than about 100 microns thick remarkably increases the amount of X-ray generation from the inner wall of the aperture hole. Further, if the aperture is heated up by directly applying a D.C. current thereto, and as thin as possible (and therefore highly resistive) aperture foil, as in the case of the embodiments according to FIGS. 2, 3 and 4, is preferable in order to reduce the capacity of the heating current power supply.

There are a number of coating methods to choose from among which are (1) the vacuum evaporation method, (2) the sputter plating method, (3) the ion plating method and (4) the chemical vapor disposition (CVD) method. The applicants chose to work with the sputter plating method under conditions where the Mo aperture foil was heated to about 700° to 900° C. Cr, W, Ta etc., wire was passed through the aperture hole so as to prevent the hole itself from being plated. The experimental results verified that the coating of tungsten remained firmly adhered to the molybdenum foil in spite of repeated applications of heating current. The results also verified that if the thickness of the coating layer exceeds about 20 microns, micro crystals emanating from the coating material (W) give rise to a rough coating surface. The ideal coating thickness of W for about 10 microns thick Mo aperture foil proved to be about 10 to 20 microns.

Other experimental data showed that the majority of the stray X-rays emitted from the underside of the foil are effectively absorbed by the layer of tungsten. The date showed, for example, that the X-ray intensity of a 10 microns thick Mo aperture foil coated with a 20 microns thick layer of tungsten as in the embodiment according to FIGS. 2 and 3, and irradiated with an electron beam accelerated by 25 KeV was only ⅓th that of a 30 microns thick uncoated Mo aperture. Foil cleaning too proved as simple and effective as in the case of the conventional foil aperture.

FIG. 5 shows yet another embodiment of the subject invention. In this case, the aperture foil 16 is made of tungsten and has a thickness of about 20 microns, and the coating material 16 is molybdenum having a thickness of about 10 microns. It will be noted that, in this embodiment, the overall thickness of the foil and coating material is the same as in the embodiments of FIGS. 2 and 3. In this case, however, the coating material is on the upper side of the foil and has an atomic number less than that of the foil. The foil (instead of the coating material) acts as the X-ray absorbing medium. The efficacy of this embodiment is identical to that of the embodiments of FIGS. 2 and 3. The tungsten foil, in this embodiment, could be replaced by Pt, Ta, Au, etc., and be equally effective.

FIG. 6 shows still yet another embodiment of this invention. In this embodiment, the tungsten aperture foil 18 is coated on the upper side with molybdenum 19 (which has a smaller atomic number than W) and on the lower side with platinum 20 (which has a larger atomic number than W). By so doing, there are two X-ray absorption layers; namely, the foil itself and the lower coating of platinum.

Having thus described our invention with the detail and particularlity required by the Patent Laws, what is claimed and desired protected by Letters Patent is set forth in the following claims:

1. In an X-ray microanalyzer, an apertured baffle comprising an apertured foil selected from the group molybdenum, tantalum, tungsten and platinum, said foil being characterized by the application of thin layers of coating material on both sides of said foil in the vicinity of the aperture, the atomic number of the coating material on one side of the foil being larger than that of the material from which the foil is constituted, and the atomic number of the coating material on the other side of the foil being smaller than that of the material from which the foil is constituted.

2. In an X-ray microanalyzer, an apertured baffle for an electron beam, said microanalyzer having an electron beam source, said baffle comprising a strip-shaped apertured foil selected from the group molybdenum, tantalum, tungsten and platinum and a power source for passing an electrical current through said foil, said strip-shaped foil having a layer of coating material on one side of the foil and in the vicinity of the aperture, the atomic number of said coating material being smaller than that of the foil if facing the electron beam source and larger than that of the foil if not facing the electron beam source.

3. In a X-ray microanalyzer, an apertured baffle for use in an electron optical system having an electron source, said baffle comprising a foil having an aperture therein, said foil being between about 10 and 50 microns thick and having a coating on at least one side and in the vicinity of the aperture between about 10 and 100 microns thick, the coating material having an atomic number smaller than that of the foil if facing the electron beam source and larger than that of the foil if not facing the electron beam source.

4. In an X-ray microanalyzer, an apertured baffle for an electron beam, said microanalyzer having an electron beam source, said baffle comprising a foil being between about 10 and 50 microns thick and having an aperture therein, said foil selected from the group molybdenum, tantalum, tungsten and platinum, said foil having a thin coating between about 10 and 100 microns thick on the side not facing the electron beam source in the vicinity of the aperture, the atomic number of the coating material being larger than that of the foil.

5. In an X-ray microanalyzer, an apertured baffle for an electron beam, said microanalyzer having an electron beam source, said baffle comprising a foil being between about 10 and 50 microns thick and having an aperture therein, said foil selected from the group molybdenum, tantalum, tungsten, platinum or gold, said foil having a thin coating between about 10 and 100 microns thick on its side facing the electron beam source in the vicinity of the aperture, the atomic number of the coating material being smaller than that of the foil.

6. In an X-ray microanalyzer, an apertured baffle comprising an apertured foil being between about 10 and 50 microns thick and selected from the group molybdenum, tantalum, tungsten and platinum, said foil being characterized by the application of thin layers between about 10 and 100 microns thick of coating material on both sides of said foil in the vicinity of the aperture, the atomic number of the coating material on one side of the foil being larger than that of the material from which the foil is constituted, and the atomic number of the coating material on the other side of the foil being smaller than that of the material from which the foil is constituted.

7. In an X-ray microanalyzer, an apertured baffle for an electron beam, said microanalyzer having an electron beam source, said baffle comprising a strip-shaped apertured foil selected from the group molybdenum, tantalum, tungsten and platinum and a power source for passing an electrical current through said foil, said strip-shaped foil having a layer of coating material on one side of the foil and in the vicinity of the aperture, the atomic number of said coating material being smaller than that of the foil if facing the electron beam source and larger than that of the foil if not facing the electron beam source.

* * * * *